United States Patent

Tsunoda et al.

[11] Patent Number: 5,536,944
[45] Date of Patent: Jul. 16, 1996

[54] THERMAL FIELD EMMISSION ELECTRON GUN

[75] Inventors: Katsuyoshi Tsunoda; Yoshinori Terui, both of Shibukawa, Japan

[73] Assignee: Denki Kagaku Kogyo Kabushiki Kaisha, Tokyo, Japan

[21] Appl. No.: 424,097

[22] Filed: Apr. 19, 1995

[30] Foreign Application Priority Data

Jun. 29, 1994 [JP] Japan ..................... 6-148115

[51] Int. Cl.⁶ ................. H01J 1/30; H01J 1/48; H01J 37/073
[52] U.S. Cl. ............. 250/423 F; 313/336; 313/310; 313/311
[58] Field of Search ............ 250/423 F, 423 R; 313/336, 362.1, 310, 311

[56] References Cited

U.S. PATENT DOCUMENTS 3,766,427 10/1973 Coates et al. ............. 250/423 F
4,379,250 4/1983 Hosoki et al. ............. 250/423 F
5,449,968 9/1995 Terui et al. ............. 313/336

FOREIGN PATENT DOCUMENTS 2-94237 4/1990 Japan.
6-12973 1/1994 Japan.

OTHER PUBLICATIONS

Thermal Field Emitter Operating Instructions, Jan. 1987, FEI Company, pp. 1–23.

Primary Examiner—Jack I. Berman
Attorney, Agent, or Firm—Oblon, Spivak, McClelland, Maier & Neustadt

[57] ABSTRACT

A thermal field emission electron gun has a thermal field emission cathode and a suppressor electrode wherein the thermal field emission cathode comprises a single crystal tungsten needle of an axis direction of <100> and a coating layer composed of zirconium and oxygen, and the suppressor electrode is composed of either titanium or an alloy including titanium as the major component, of which hydrogen content is 60 ppm or less. Electron beams can be stably obtained with good reproducibility in a short time.

7 Claims, 2 Drawing Sheets

5,536,944

THERMAL FIELD EMMISSION ELECTRON GUN

BACKGROUND OF THE INVENTION

1. Field of the Invention

The present invention relates to a thermal field emission electron gun used for an electron beam machine such as an electron microscope, an electron beam machine for measuring the length of semiconductors, an electron beam lithograph machine, an electron beam tester or the like.

2. Discussion of Background

In recent years, in order to obtain an electron beam machine of low acceleration voltage requirements, a high resolution and a high throughput, an electron source capable of supplying stably a high current density at a low voltage has been required. For this, there has been used a thermal field emission electron gun comprising a thermal field emission cathode and a suppressor electrode wherein the cathode has a single crystal tungsten needle having an axis of direction of <100> which is covered with a coating layer comprising zirconium and oxygen, for reasons that it has a high brightness and a long service life in comparison with a conventional thermal field emission electron gun, and it operates more stable than a cold field emission electron gun.

In the conventional thermal field emission electron gun, molybdenum was used for the suppressor electrode (a pamphlet "Thermal Field Emitter Operating Instructions, Jan., 1987" published by FEI Company). However, the surface of molybdenum was easily oxidized and the oxide of molybdenum was apt to absorb gas. Accordingly, there were problems that the degree of vacuum was deteriorated in the use of the thermal field emission electron gun; the occurrence of an electric discharge might break it, or the rising time of emission was long.

For this problems, the material for the suppressor electrode has been studied.

For instance, Japanese Unexamined Patent Publication No. 94237/1990 discloses use of stainless steel which suppresses discharging of gas and prevents the breakage of the gun due to an electric discharge phenomenon.

Further, Japanese Unexamined Patent Publication No. 12973/1994 discloses that material having a diffusion coefficient of hydrogen gas smaller than a predetermined value is used for the suppressor electrode, and a stable rising time is obtainable without producing the electric discharge phenomenon by operating the gun under predetermined conditions of operation.

However, even in the disclosed methods, electron beams could not be stably obtained in a short time.

SUMMARY OF THE INVENTION

It is an object of the present invention to provide a thermal field emission electron gun which can reproduce stably electron beams in a short time and can minimize the deterioration of the degree of vacuum under the conditions of use.

It is another object of the present invention to provide a suppressor electrode for the thermal field emission electron gun providing superior processing characteristics at a low manufacturing cost.

In accordance with the present invention, there is provided a thermal field emission electron gun which comprises a thermal field emission cathode and a suppressor electrode, wherein the thermal field emission cathode comprises a single crystal tungsten needle having an axis direction of <100> and a coating layer of zirconium and oxygen formed on the surface of the single crystal tungsten needle, and the suppressor electrode is composed of either titanium or an alloy including titanium as the major component, of which hydrogen content is 60 ppm or less.

In another aspect of the present invention, the suppressor electrode is composed of titanium having a purity of 99.0 wt % or more. Further, the greatest particle size of the crystal of titanium is 150 μm or less.

Further, in the thermal field emission electron gun of the present invention, the suppressor electrode is composed of titanium or an alloy including titanium as the major component, of which hydrogen content is 60 ppm or less, wherein the surface roughness of a portion of at least the outer surface of the suppressor electrode is 0.8 μm or less in terms of average roughness at the center line.

The present invention is to provide a thermal field emission electron gun wherein the suppressor electrode is composed of titanium or an alloy including titanium as the major component, of which hydrogen content is 60 ppm or less, which is obtained by a heat treatment in vacuum.

The present invention is to provide a thermal field emission electron gun wherein the suppressor electrode is composed of titanium or an alloy including titanium as the major component, which is obtained by a heat treatment of 2 hours or more under conditions of a pressure of $1 \times 10^{-4}$ Torr or less and a temperature of 500° C.–850° C.

Further, the present invention is to provide a thermal field emission electron gun wherein the suppressor electrode is composed of titanium or an alloy including titanium as the major component, which is obtained by a heat treatment of 2 hours or more under conditions of a pressure of $1 \times 10^{-4}$ Torr or less and at a temperature of 700° C.–800° C.

Further, the present invention relates to an electron beam machine using the above-mentioned thermal field emission electron gun, such as an electron microscope, an electron beam machine for measuring the length of semiconductors or an electron beam lithograph machine.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
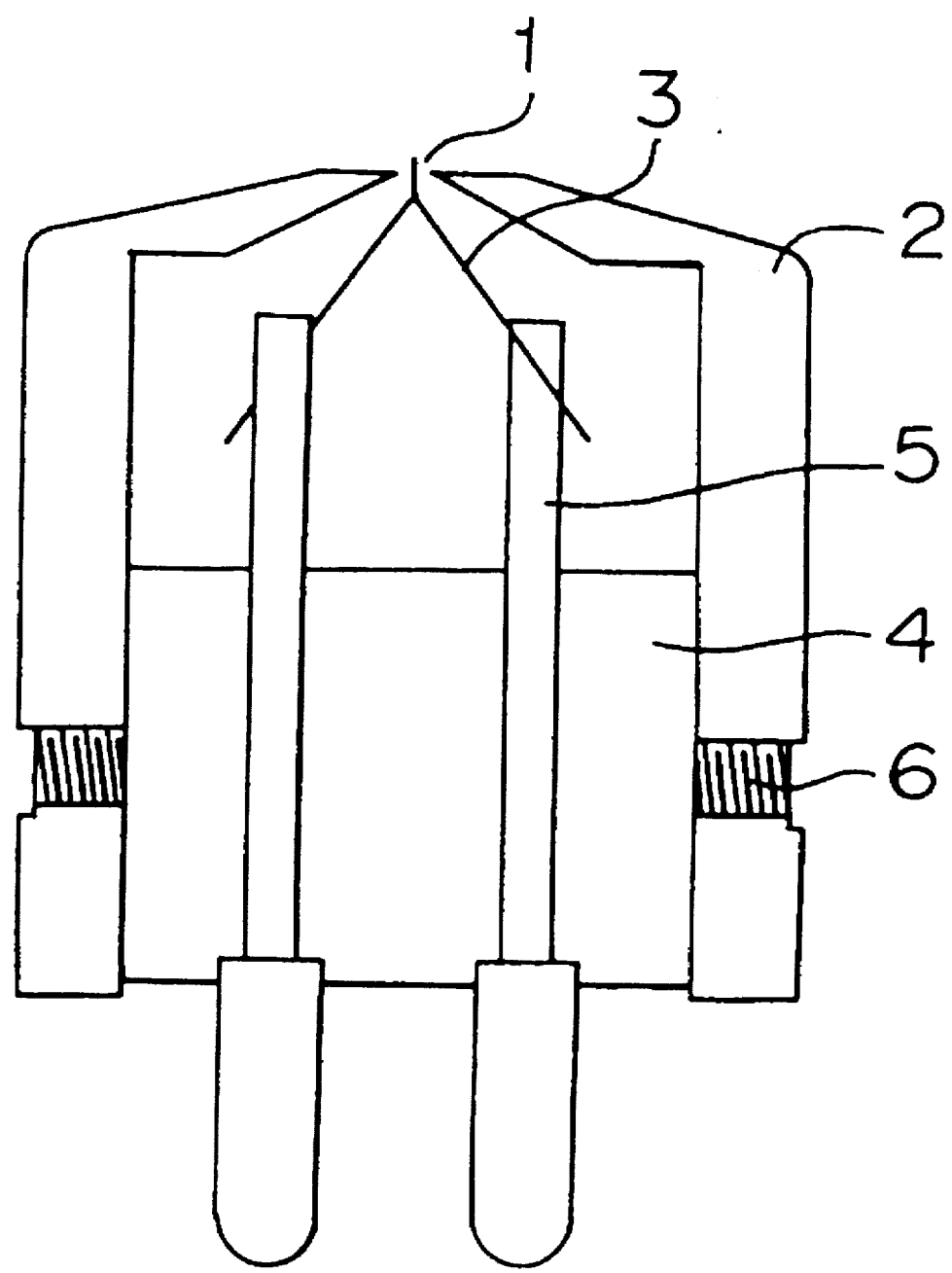
FIG. 1 is a schematic view showing in cross section an embodiment of the thermal field emission electron gun of the present invention.

Referring to the drawings, the thermal field emission electron gun of the present invention will be described in detail.

In FIG. 1, a single crystal tungsten needle 1 has an axis direction of <100> and a coating layer of zirconium and oxygen which covers the surface of it. The single crystal tungsten needle 1 is fixed by welding to a tungsten filament 3 which supports and heats the needle 1. The tungsten filament 3 is fixed by welding to a pair of metallic supports 5 which penetrate through and are secured by an insulator 4 of alumina. A suppressor electrode 2 is fixed to the insulator 4 by means of fixing screws 6 provided at the side surface of the suppressor electrode 2. The length of the single crystal tungsten needle 1 is adjusted so that it extends from the suppressor electrode 2 with a suitable height.

A thermal field emission electron gun is usually used at a temperature of about 1,500° C. and under a vacuum condition of about $10^{-9}$ Torr. Accordingly, the suppressor electrode 2 has to be formed of an electric conductive and non-magnetic material which is free from producing gas under conditions of high temperature and high vacuum degree.

The suppressor electrode 2 is processed to have an opening of about 0.4 mm in diameter at its central portion, through which the top end of the single crystal tungsten needle 1 having a thickness of about 0.13 mm is projected. Accordingly, the suppressor electrode 2 has to be processed to have precise dimensions. Further, it is necessary for the suppressor electrode 2 not to cause any dimensional error even when it is combined with another element such as the insulator 4 and used in a high temperature condition.

The inventors of the present application have made extensive study and have found experimentally that when titanium or an alloy including titanium as the major component, of which a hydrogen content of 60 ppm or less, is used for the suppressor electrode, it satisfies the before-mentioned characteristics and achieves the purpose of the present invention.

As the titanium or an alloy including titanium as the major component used for the present invention, there are non-magnetic titanium alloys such as pure titanium for industrial use of 99% or more ruled by standards such as JIS, ASTM and so on, a 0.15 Pd-added titanium alloy, a 5 Ta-added titanium alloy, a 5 Al-2.5 Sn-added titanium alloy, a 8 Al-i Mo-1 V-added titanium alloy, a 6 Al-4 V-added titanium alloy, a 6 Al-6 V-2 Sn-added titanium alloy, a 6 Al-2 Sn-4Zr-2 Mo-added titanium alloy.

In order to obtain electron beams stably with good reproducibility in a short time which is an object of the present invention, it is essential to use titanium or an alloy including titanium as the major component for the suppressor electrode 2. The suppressor electrode composed of titanium or an alloy including titanium as the major component has a feature that an amount of gas produced is very small under the conditions of use.

When titanium contacts the atmosphere whereby a very thin oxide layer is formed on the surface of it, there is no further oxidation. Further, the rate of oxide gas absorption is extremely smaller than that of molybdenum which has been used in the conventional technique. Due to the above-mentioned characteristics, a gas absorption quantity in the oxide layer of titanium or an alloy including titanium as the major component is very small. Accordingly, the suppressor electrode composed of titanium or an alloy including titanium as the major component can minimize a quantity of gas produced due to the collision of ions under the conditions of use in comparison with the conventionally used molybdenum.

In addition, titanium or an alloy including titanium as the major component has such features that it has an excellent machining quality in comparison with molybdenum; it is rare to produce cracks in a thin wall portion, and a surface obtained by cutting is smooth. When the cut surface is rough, the gas absorption quantity is increased because the surface area of a workpiece is substantially increased. Since titanium or an alloy including titanium as the major component has an excellent machining quality, it is easy to obtain a smooth surface, which is effective to reduce the gas absorption quantity.

Further, the yield in processing can be improved and a time of processing can be reduced, whereby cost for processing is inexpensive in comparison with a case of using molybdenum.

Among titanium and an alloy including titanium as the major component, titanium having a high purity, in particular, titanium having a degree of purity of 99.0% or more is preferably used. Since titanium having a purity of 99.0% or more is excellent in processability and provides a smooth cut surface, a suppressor electrode having a minimum surface area and a low gas absorption quantity can be obtained.

As to the particle size of the crystal of titanium, it is preferable to use the crystal having the maximum diameter of 150 µm or less. When the crystal particles include those exceeding 150 µm, the processability is decreased due to the anisotropy. Further, the gas absorption quantity is increased because the surface area of the workpiece is increased.

As to the surface roughness of the suppressor electrode, the suppressor electrode should ideally have smooth surface in its entirety. However, there is a limit from the viewpoint of manufacturing cost and processing technique. The inventors of this application have studied the limit to determine a degree of smoothness and a range of the area of smoothness whereby the object of the present invention can be achieved. Namely, it is enough for the suppressor electrode to have a surface roughness of 0.8 µm or less. Further, it is sufficient that a part near the outer side surface of an opening formed in the suppressor electrode through which a needle electrode extends is smooth, and it is not always to form the smooth surface in the entire surface of the suppressor electrode.

In the present invention, the hydrogen content of titanium or an alloy including titanium as the major component is 60 ppm or less. The inventors have experimentally found that the object of the present invention to obtain stable electron beams with good reproducibility in a short time can be achieved when the hydrogen content is 60 ppm or less. Namely, when titanium or an alloy including titanium as the major component having a hydrogen content of 60 ppm or less is used, the gas production rate can be remarkably reduced. Since, the pressure of gas at that time does not exceed $5\times10^{-9}$ Torr, there is no deterioration of vacuum. Then, there is no influence to electron beams. On the other hand, when titanium or an alloy including titanium as the major component having a hydrogen content of more than 60 ppm is used, a much amount of gas is produced and the pressure exceeds $5\times10^{-9}$ Torr, whereby electron beams become unstable. Further, a discharge time necessary for obtaining a low pressure whereby electron beams are stable, becomes long.

The suppressor electrode of the present invention is prepared by machining a commercially available thick plate or rod of titanium or an alloy including titanium as the major component. Since commercially available titanium or alloy including titanium as the major component generally contains hydrogen of 150 ppm or less. Accordingly, analysis should be made on the hydrogen content before use so that titanium or an alloy including titanium having a hydrogen content of 60 ppm or less is chosen. Alternatively, the hydrogen content can be reduced to 60 ppm or less by subjecting the commercially available material to a heat treatment at a temperature of more than 500° C. under a pressure of $1\times10^{-4}$ Torr or less (i.e. in vacuum) for several hours. The heat treatment may be conducted either before the machining operation or after the machining operation.

Considering the pressure at the time of the heat treatment of titanium or an alloy including titanium as the major component, a pressure of $1\times10^{-4}$ Torr or less is preferable. However, a pressure of $1\times10^{-5}$ Torr or less is more preferable. When the pressure is less than $1\times10^{-4}$ Torr, a small amount of oxygen or nitrogen which remains without discharge may react with titanium or an alloy including titanium as the major component. Thus, use of a pressure of $1\times10^{-5}$ Torr or less can completely prevent such undesirable phenomenon.

The temperature for heating is preferably in a range of 500° C.–850° C., more preferably, 700° C.–800° C. It is not practical to conduct a heat treatment at less than 500° C. and under a pressure of less than $1\times10^{-4}$ Torr because the discharge rate of hydrogen gas is small. On the other hand, a heat treatment at more than 850° C. is not desirable because titanium or an alloy including titanium as the major component causes transformation at about 880° C. Accordingly, a preferable temperature range is 700° C.–800° C. in order to obtain a practically high discharge rate of hydrogen gas and to achieve a predetermined effect in a short time heat treatment.

In using an electron microscope, an electron beam machine for measuring the length of semiconductors or an electron beam lithograph machine in which the thermal field emission electron gun of the present invention is employed, electron beams emitted from the thermal field emission electron gun have to be sufficiently stable in order to assure the performance such as resolving power, dimensional accuracy, reproducibility and so on, of the machine. Further, it is necessary to determine conditions for the machine so as to obtain sufficiently stable electron beams.

In the conventional electron beam machine using the conventional thermal field emission gun, it took a long time until electron beams became stable, and the reproducibility was insufficient. Accordingly, a long time such as two or more than 3 days was needed for the adjustment of the machine.

With use of the thermal field emission electron gun of the present invention, electron beams can be obtained in a stable manner with good reproducibility in a short time, and the adjustment of an electron beam machine can be finished in a short time such as about a day.

Now, the present invention will be described in further detail with reference to Examples. However, it should be understood that the present invention is by no means restricted by such specific Examples.

EXAMPLES 1 to 4 and COMPARATIVE EXAMPLES 1 to 4

Round rods (diameter of 20 mm× length of 50 mm) were prepared by using commercially available titanium of a hydrogen content of 105 ppm and a 6 Al-4 V-added titanium alloy. The round rods were subjected to heat treatments under a vacuum degree of $5\times10^{-6}$ Torr (temperature and time are described in Table 1). The hydrogen content of the round rods was measured by the method described in JIS Z 2614.

Suppressor electrodes were prepared by machining the round rods of titanium or titanium alloy which have been subjected to heat treatments. The surface roughness of each of the suppressor electrodes was measured according to JIS B 0601 with respect to the outer surface region of a flat portion near the opening through which the single crystal tungsten needle extends. It was found that the surface roughness in average at the center line was 0.7 μm (cut-off value: 0.8 mm and length of measurement: 3 mm).

Each thermal field emission cathode was prepared by fixing by welding a tungsten wire to metallic supports in an insulator; fixing by welding a single crystal tungsten needle to the tungsten wire; sharpening the top end of the single crystal tungsten needle by an electropolishing method; heating the needle at about 1,500° C., and forming on the needle a coating layer composed of zirconium and oxygen. Each of the suppressor electrodes is fixed to each of the thermal field emission cathodes with screws to unify them. Thus, the thermal field emission electron guns were prepared.

Figure 2:
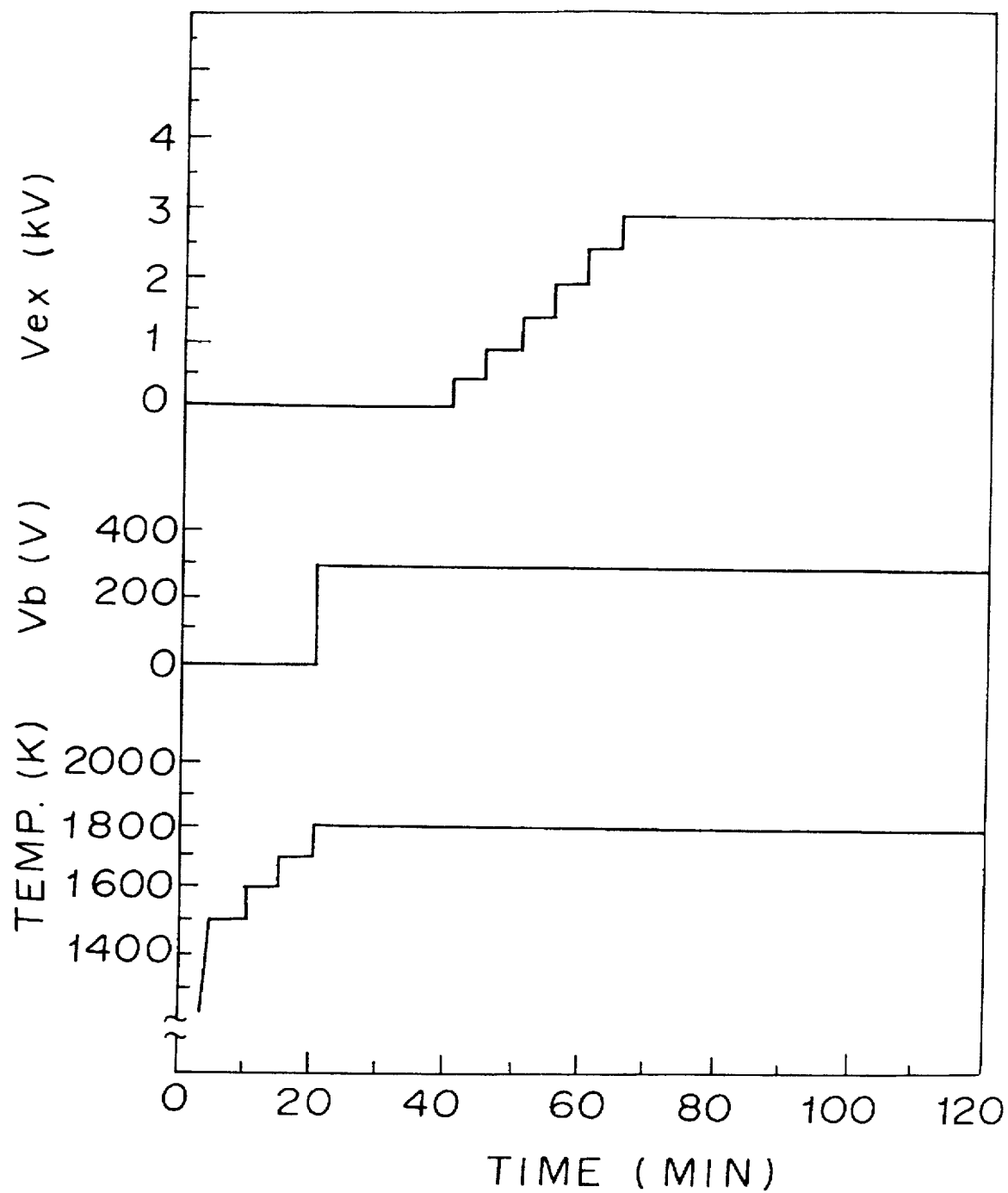
FIG. 2 is a diagram showing a state of the starting of operation of the thermal field emission electron gun of the present invention in connection to temperature and voltages vs time.

These thermal field emission electron guns were put in a vacuum container in which air was discharged to reach $5\times10^{-10}$ Torr, and electron beams were emitted from the electron guns to examine the, deterioration of vacuum and a time needed for stable electron beams after rising operations had been finished. The time point to obtain stable electron beams after the rising operation was determined as the time when the degree of variability of electron beams per time became 1%/Hr or less. The method as shown in FIG. 2 was used for the rising operation wherein Vex represents a driving voltage and Vb represents a bias voltage.

As Comparative Example 4, measurement was made for the thermal field emission electron guns in which the conventional suppressor electrodes of molybdenum were used.

Table 1 shows a result of the measurements. The thermal field emission electron guns of the present invention show a desirable result wherein electron beams become stable in a short time after the completion of the rising operation.

Table 2 shows a result of the measurements wherein the thermal field emission electron gun in Example 1 mounted on an electron beam lithograph machine, the thermal field emission electron gun in Example 2 mounted on an electron beam machine for measuring the length of semiconductors, and the thermal field emission electron gun in Example 3 mounted on an electron microscope are compared with the conventional thermal field emission electron gun in Comparative Example 4 in which the suppressor electrode of molybdenum is used. The Tables show that the rising operation of the machine employing the present invention can be easy and a preferable effect can be obtained.

Obviously, numerous modifications and variations of the present invention are possible in light of the above teachings. It is therefore to be understood that within the scope of the appended claims, the invention may be practiced otherwise than as specifically described herein.

TABLE 1

|  | Material for suppressor electrode | Conditions for heating titanium | | Hydrogen content in titanium after heat treatment (ppm) | Degree of vacuum at the deterioration of vacuum (Torr) | Quantity of electron beam (μA) | Time to obtain stable electron beams (Hr) |
| --- | --- | --- | --- | --- | --- | --- | --- |
|  |  | Temperature (°C.) | Time (Hr) |  |  |  |  |
| Example 1 | Titanium | 700 | 4 | 24 | $1.3 \times 10^{-9}$ | 193 | 1.0 |
| Example 2 | Titanium | 600 | 3 | 42 | $2.6 \times 10^{-9}$ | 181 | 1.0 |
| Example 3 | Titanium | 500 | 2 | 60 | $4.1 \times 10^{-9}$ | 180 | 2.5 |
| Example 4 | 6 Al-4 V-added titanium alloy | 500 | 3 | 51 | $3.7 \times 10^{-9}$ | 184 | 2.0 |
| Comparative Example 1 | Titanium | 450 | 1 | 73 | $8.0 \times 10^{-9}$ | 155 | 7.0 |
| Comparative Example 2 | Titanium | — | — | 105 | $2.2 \times 10^{-8}$ | 128 | 12.0 |
| Comparative Example 3 | 6 Al-4 V-added titanium alloy | — | — | 88 | $1.4 \times 10^{-8}$ | 139 | 9.0 |
| Comparative Example 4 | Molybdenum | — | — | — | $4.6 \times 10^{-9}$ | 167 | 4.5 |

TABLE 2

|  | Material for suppressor electrode | Applicable electron beam machine | Result (in comparison with Comparative Example 4) |
| --- | --- | --- | --- |
| Example 1 | Titanium | Electron beam lithograph machine | The rising time could be shortened. |
| Example 2 | Titanium | Electron beam machine for measuring the length of semiconductor. | The rising time could be shortened. |
| Example 3 | Titanium | Electron microscope | he rising time could be shortened and the brightness was slightly increased. |
| Comparative Example 4 | Molybdenum | The above-mentioned machines. | — |

What is claimed is:

1. A thermal field emission electron gun which comprises a thermal field emission cathode and a suppressor electrode, wherein the thermal field emission cathode comprises a single crystal tungsten needle having an axis direction of <100>and a coating layer of zirconium and oxygen formed on the surface of the single crystal tungsten needle, and the suppressor electrode is composed of either titanium or an alloy including titanium as the major component, of which hydrogen content is 60 ppm or less.

2. The thermal field emission electron gun according to claim 1, wherein the suppressor electrode is composed of titanium having a purity of 99.0 wt % or more.

3. The thermal field emission electron gun according to claim 1, wherein the greatest particle size of the crystal of titanium is 150 μm or less.

4. The thermal field emission electron gun according to claim 1, wherein the surface roughness of a portion of at least the outer surface of the suppressor electrode is 0.8 μm or less in terms of average roughness at the center line.

5. The thermal field emission electron gun according to claim 1, wherein the suppressor electrode is composed of titanium or a titanium alloy obtained by a heat treatment in vacuum.

6. The thermal field emission electron gun according to claim 5, wherein the heat treatment is conducted in vacuum under a pressure of $1 \times 10^{-4}$ Torr or less and at a temperature of 500° C.–850° C. for more than 2 hours.

7. The thermal field emission electron gun according to claim 5, wherein the heat treatment is conducted in vacuum under a pressure of $1 \times 10^{-4}$ Torr or less and at a temperature of 700° C.–800° C. for more than 2 hours.

* * * * *

UNITED STATES PATENT AND TRADEMARK OFFICE
CERTIFICATE OF CORRECTION

PATENT NO. : 5,536,944
DATED : July 16, 1996
INVENTOR(S) : Katsuyoshi TSUNODA, et al.

It is certified that error appears in the above-indentified patent and that said Letters Patent is hereby corrected as shown below:

On the title page, item [54] and column 1, line 1, "EMMISSION" should read --EMISSION--.

Signed and Sealed this

First Day of October, 1996

Attest:

BRUCE LEHMAN

Attesting Officer     Commissioner of Patents and Trademarks